US009070830B2

(12) United States Patent
Chou et al.

(10) Patent No.: US 9,070,830 B2
(45) Date of Patent: Jun. 30, 2015

(54) ELECTRODE CONTACT STRUCTURE OF LIGHT-EMITTING DIODE WITH IMPROVED ROUGHNESS

(71) Applicant: HIGH POWER OPTO. INC., Taichung (TW)

(72) Inventors: Li-Ping Chou, Taichung (TW); Fu-Bang Chen, Taichung (TW); Chih-Sung Chang, Taichung (TW)

(73) Assignee: HIGH POWER OPTO. INC., Taichung (TW)

( * ) Notice: Subject to any disclaimer, the term of this patent is extended or adjusted under 35 U.S.C. 154(b) by 43 days.

(21) Appl. No.: 13/948,981

(22) Filed: Jul. 23, 2013

(65) Prior Publication Data

US 2013/0313598 A1 Nov. 28, 2013

Related U.S. Application Data

(63) Continuation-in-part of application No. 13/478,318, filed on May 23, 2012, now abandoned.

(51) Int. Cl.
*H01L 33/00* (2010.01)
*H01L 33/36* (2010.01)
*H01L 33/22* (2010.01)
*H01L 33/38* (2010.01)
*H01L 33/40* (2010.01)

(52) U.S. Cl.
CPC ............. *H01L 33/36* (2013.01); *H01L 33/22* (2013.01); *H01L 33/382* (2013.01); *H01L 33/40* (2013.01)

(58) Field of Classification Search
USPC .............................................. 257/98, 100, 99
See application file for complete search history.

(56) References Cited

U.S. PATENT DOCUMENTS

| | | | |
|---|---|---|---|
| 2008/0035953 A1* | 2/2008 | Beom et al. ................ | 257/103 |
| 2008/0283819 A1 | 11/2008 | Konno | |
| 2009/0159917 A1* | 6/2009 | Jeong .......................... | 257/98 |
| 2010/0078659 A1* | 4/2010 | Iizuka et al. ................. | 257/94 |
| 2011/0193120 A1* | 8/2011 | Kazama ....................... | 257/98 |
| 2012/0043566 A1* | 2/2012 | Wu et al. ..................... | 257/94 |

* cited by examiner

*Primary Examiner* — Bilkis Jahan
(74) *Attorney, Agent, or Firm* — Muncy, Geissler, Olds & Lowe, P.C.

(57) ABSTRACT

An LED electrode contact structure for an LED is provided. The LED includes a plurality of N-type electrodes, an N-type semiconductor layer, a light-emitting layer, a P-type semiconductor layer, a mirror layer, a buffer layer, a binding layer, a permanent substrate and a P-type electrode that are stacked in sequence. The N-type semiconductor layer has an irregular surface and a plurality of contact platforms. The contact platforms are formed and distributed on the N-type semiconductor layer in a patterned arrangement, and the irregular surface is formed at areas on the N-type semiconductor layer without the contact platforms. The N-type electrodes are respectively formed on the contact platforms. The contact platforms have roughness between 0.01 μm and 0.1 μm, such that not only voids are not generated but also good adhesion is provided to prevent carrier confinement and disengagement. Therefore, satisfactory electrical contact is ensured to thereby increase light emitting efficiency.

7 Claims, 10 Drawing Sheets

ELECTRODE CONTACT STRUCTURE OF LIGHT-EMITTING DIODE WITH IMPROVED ROUGHNESS

This application is a continuation-in-part, and claims priority, of from U.S. patent application Ser. No. 13/478,318 filed on May 23, 2012, entitled "ELECTRODE CONTACT STRUCTURE OF LIGHT-EMITTING DIODE", the entire contents of which are hereby incorporated by reference.

FIELD OF THE INVENTION

The present invention relates to a light-emitting diode (LED), and particularly to an electrode contact structure of an LED.

BACKGROUND OF THE INVENTION

A light-emitting diode (LED), offering advantages of being compact in size and power-saving, prevails in applications including illuminations, traffic lights and commercial signs. An LED is principally formed by a semiconductor material with multiple stacked epitaxial layers. For example, a blue-light LED is mainly consisted of gallium nitride-based (GaN-based) epitaxial thin films.

Referring to FIGS. 1A and 1B, a conventional vertical LED includes a sandwich structure formed by an N-type semiconductor layer 1, a light-emitting layer 2 and a P-type semiconductor layer 3. Below the P-type semiconductor layer 3, a mirror layer 4, a buffer layer 5, a binding layer 6, a silicon substrate 7 and a P-type electrode 8 are formed in sequence. A surface of the N-type semiconductor layer 1 is processed by a roughening treatment for increasing light extraction. An N-type electrode 9 is further provided. By applying a voltage to the N-type electrode 9 and the P-type electrode 8, the N-type semiconductor layer 1 is enabled to provide electrons and the P-type semiconductor layer 3 is enabled to provide holes. Light is produced by the electrons and holes combining at the light-emitting layer 2.

As previously stated, to increase light extraction, the surface of the N-type semiconductor layer 1 is processed by a roughening treatment to form an irregular surface 1A, upon which the N-type electrode 9 is directly formed. Further, the N-type electrode 9 is generally formed by a thin-film process such as sputtering or evaporation. As a result, as shown in FIG. 1B, voids 1B are formed at blind corners of the irregular surface 1A. The voids 1B not only cause poor contact that increases contact impedance, but are also likely to generate dangling bonds in molecules that limit carriers when manufacturing the irregular surface 1A. Consequently, the overall light emitting efficiency is degraded.

As disclosed by the US Publication US20100078659, an N-type metal electrode 101 is first deposited before fabricating an irregular surface on an N-type semiconductor layer 103. Thus, voids between the N-type semiconductor layer 103 and the N-type metal electrode 101 are prevented. However, as surfaces between the N-type metal electrode 101 and the N-type semiconductor layer 103 are flat surfaces, another issue of disengagement due to insufficient adhesion incurs although voids are prevented.

SUMMARY OF THE INVENTION

Therefore, the primary object of the present invention is to provide a light-emitting diode (LED) electrode contact structure for an LED to prevent issues of voids and disengagement generated between electrodes and a semiconductor structure to thus increase light emitting efficiency and stability.

An LED electrode contact structure for an LED is provided according to an embodiment of the present invention. The LED comprises a plurality of N-type electrodes, an N-type semiconductor layer, a light-emitting layer, a P-type semiconductor layer, a mirror layer, a buffer layer, a binding layer, a permanent substrate and a P-type electrode that are stacked in sequence. Further, an irregular surface is formed on the N-type semiconductor layer.

The present invention is characterized in that the N-type semiconductor layer includes a plurality of contact platforms which are formed and distributed thereon in a patterned arrangement. On the N-type semiconductor layer, the irregular surface is formed at areas without the contact platforms. Further, the N-type electrodes are respectively formed on the contact platforms, and roughness of the contact platforms is between 0.01 μm and 0.1 μm Accordingly, in the present invention, the N-type electrodes are respectively formed on the contact platforms. Through interfaces having appropriate roughness provided by the contact platforms, when the N-type electrodes are formed by a thin-film process, not only voids are not generated but also good adhesion is provided to at the same time prevent issues of carrier confinement and disengagement caused by generation of dangling bonds of molecules in the fabrication of the irregular surface. Therefore, the structure of the present invention ensures satisfactory electrical contact between the N-type electrodes and the contact platforms. Further, since the N-type electrodes are manufactured on the contact platforms having appropriate roughness, surfaces of the N-type electrodes are also formed with appropriate roughness with the roughness between 0.01 μm and 0.1 μm, thereby enhances stability of contact surfaces between conductive wires and N-pads to increase the light emitting efficiency and stability.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENTS

In the following detailed description, for purposes of explanation, numerous specific details are set forth in order to provide a thorough understanding of the disclosed embodiments. It will be apparent, however, that the embodiments are for exemplary examples for illustrating the prevent invention and are not to be construed as limiting the present invention thereto.

Figure 1A:
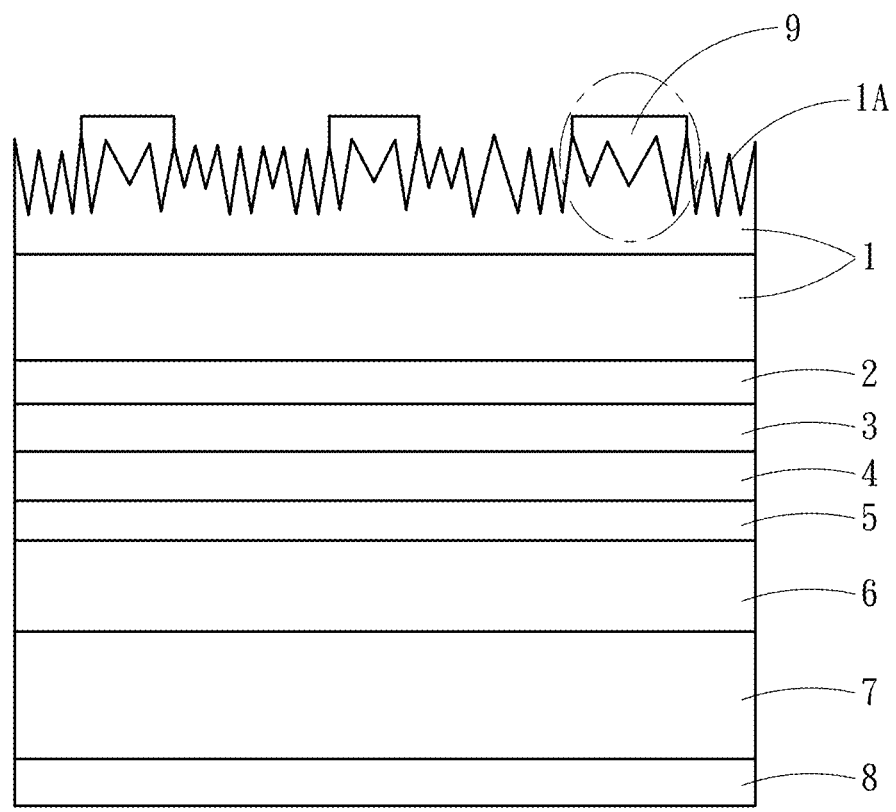
FIG. 1A is a schematic diagram of a conventional LED.
Figure 1B:
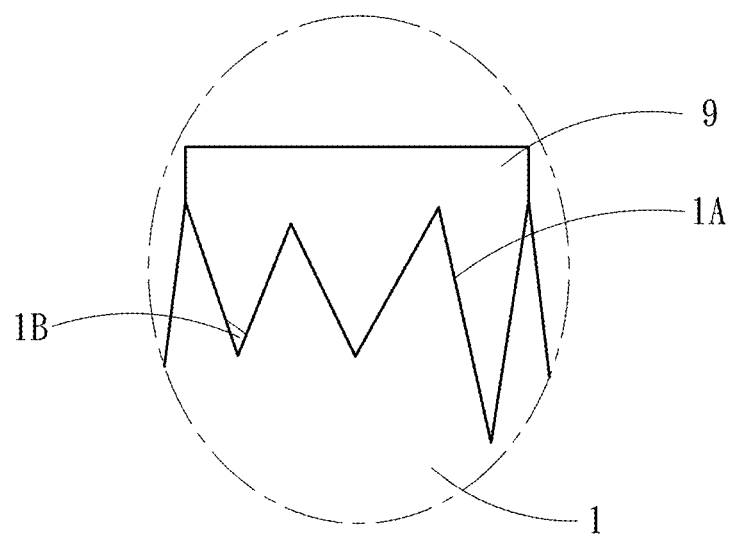
FIG. 1B depicts voids in a conventional LED.
Figure 2:
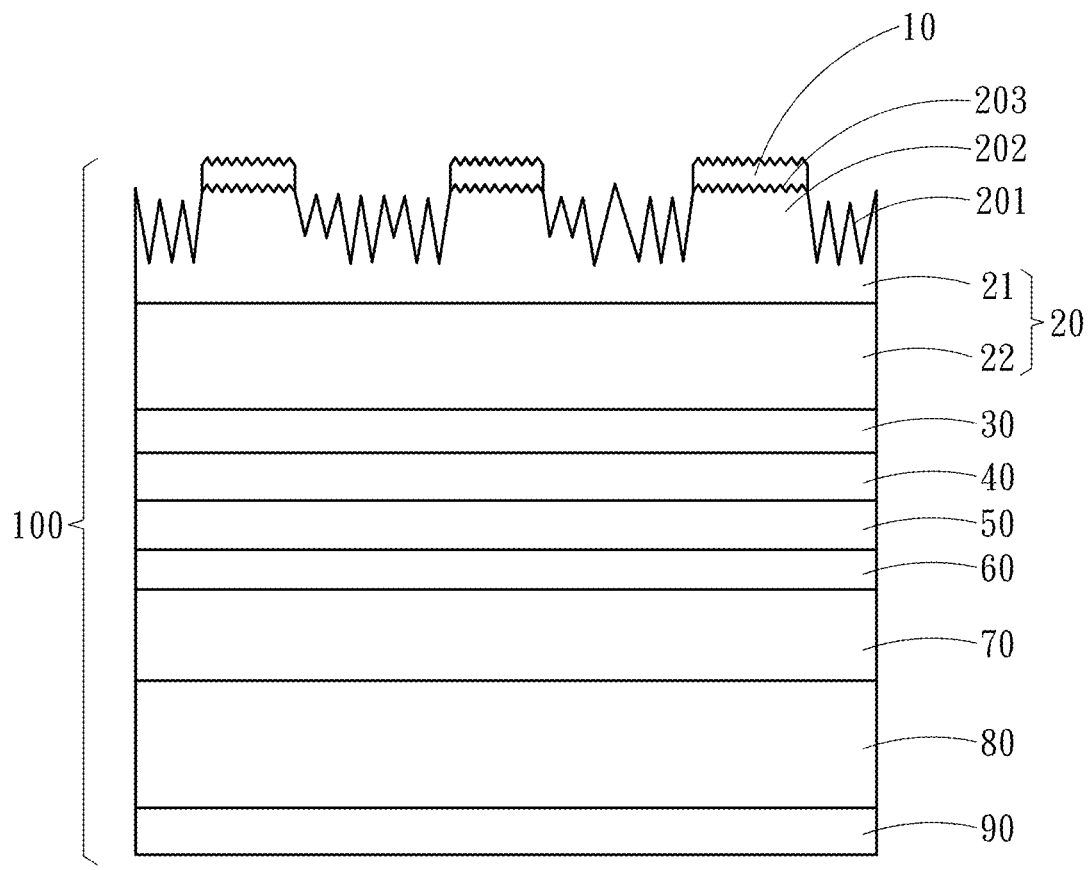
FIG. 2 is a schematic diagram of an LED structure according to one embodiment of the present invention.

FIG. 2 shows a schematic diagram of an LED electrode structure for an LED according to one embodiment of the present invention. An LED 100 comprises a plurality of N-type electrodes 10, an N-type semiconductor layer 20, a light-emitting layer 30, a P-type semiconductor layer 40, a mirror layer 50, a buffer layer 60, a binding layer 70, a permanent substrate 80 and a P-type electrode 90 that are stacked in sequence. An irregular surface 201 is formed on the N-type semiconductor layer 20.

The N-type semiconductor layer 20 integrally forms a plurality of contact platforms 202. The contact platforms 202 are formed and distributed on the N-type semiconductor layer 20 in a patterned arrangement. On the N-type semiconductor layer 20, the irregular surface 201 is formed at areas without the contact platforms 202. The N-type electrodes 10 are respectively formed on the contact platforms 202. The contact platforms have roughness between 0.01 μm and 0.1 μm, and surfaces of the N-type electrodes 10 are also formed with roughness between 0.01 μm and 0.1 μm. Further, the irregular surface 201 has roughness between 0.5 μm and 1 μm.

FIGS. 3A to 3F show schematic diagrams of a manufacturing process according to one embodiment of the present invention.

Figure 3A:
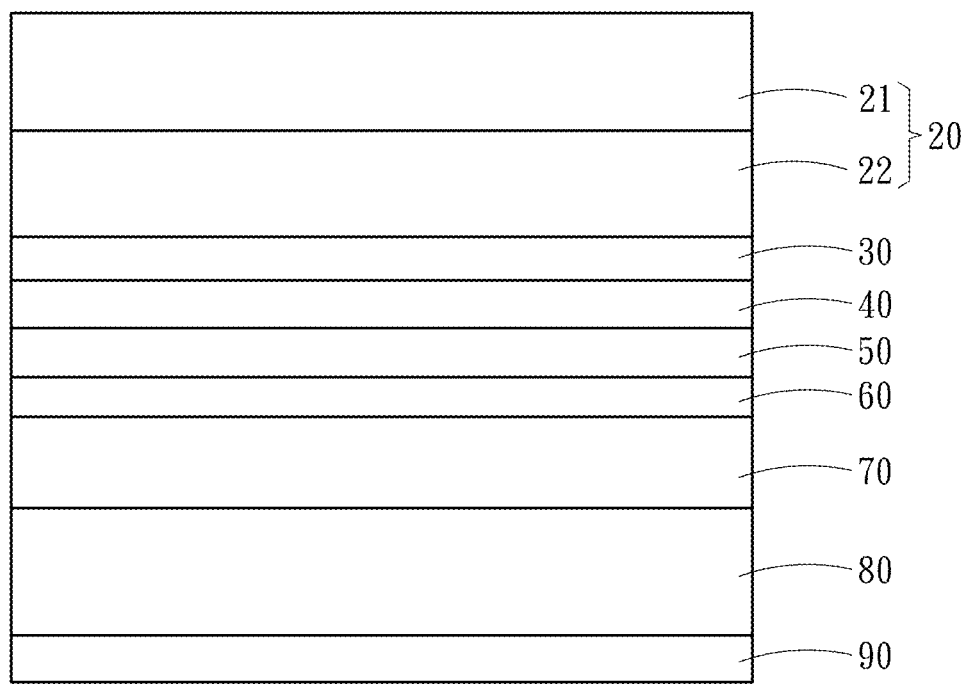
FIGS. 3A to 3F are schematic diagrams of a manufacturing process of an LED structure according to one embodiment of the present invention.

Referring to FIG. 3A, an N-type semiconductor layer 20, a light-emitting layer 30, a P-type semiconductor layer 40, a mirror layer 50, a buffer layer 60, a binding layer 70, a permanent substrate 80 and a P-type electrode 90 are sequentially stacked. The N-type semiconductor layer 20 comprises a first N-type semiconductor layer 21 and a second N-type semiconductor layer 22. The buffer layer 60 is made of a material selected from the group consisting of titanium, tungsten, platinum, nickel, aluminum and chromium. The binding layer 70 is made of a material selected from the group consisting of a gold tin alloy, a gold indium alloy and a gold lead alloy. The permanent substrate 80 is selected from the group consisting of a silicon substrate, a copper substrate, a copper tungsten substrate, an aluminum nitride substrate and a titanium nitride substrate. The mirror layer 50 is made of a material selected from the group consisting of aluminum, nickel, silver and titanium.

Figure 3B:
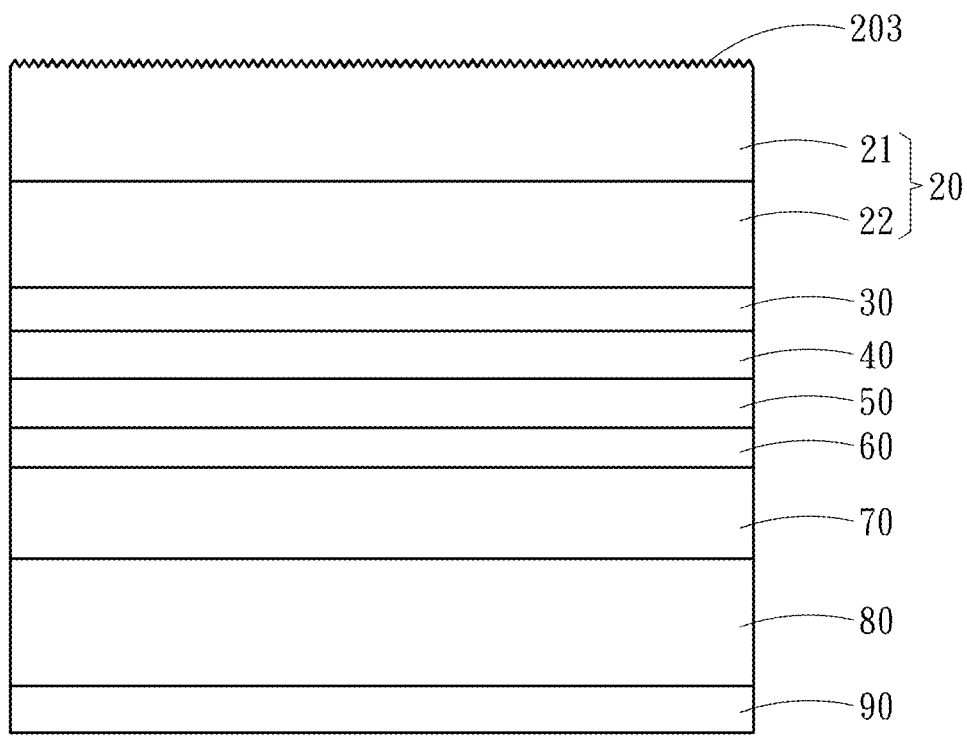

Referring to FIG. 3B, by a roughening process, an adhesion surface 203 having roughness between 0.01 μm and 0.1 μm is formed on the N-type semiconductor layer 20 (i.e., the first N-type semiconductor layer 21). For example, the adhesion surface 203 may be formed by a physical approach such as plasma impact.

Figure 3C:
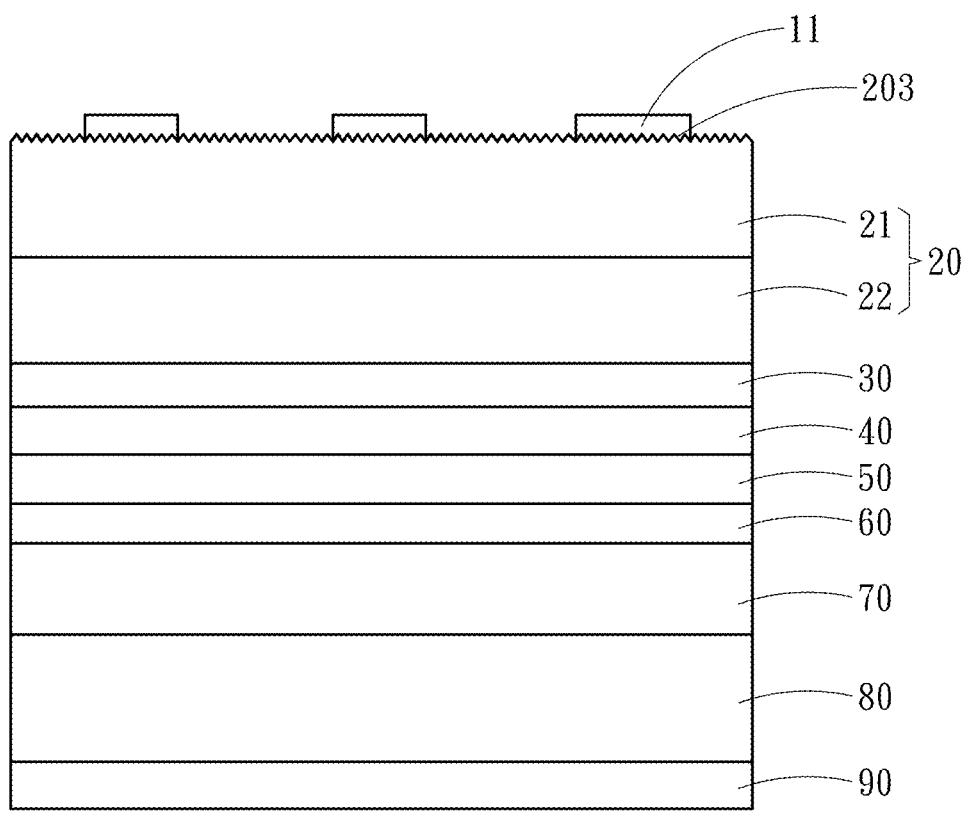

Referring to FIG. 3C, by a thin-film process such as evaporation, a plurality of etch protection layers 11 are formed on the adhesion surface 203 of the N-type semiconductor layer 20 (i.e., the first N-type semiconductor layer 21).

Figure 3D:
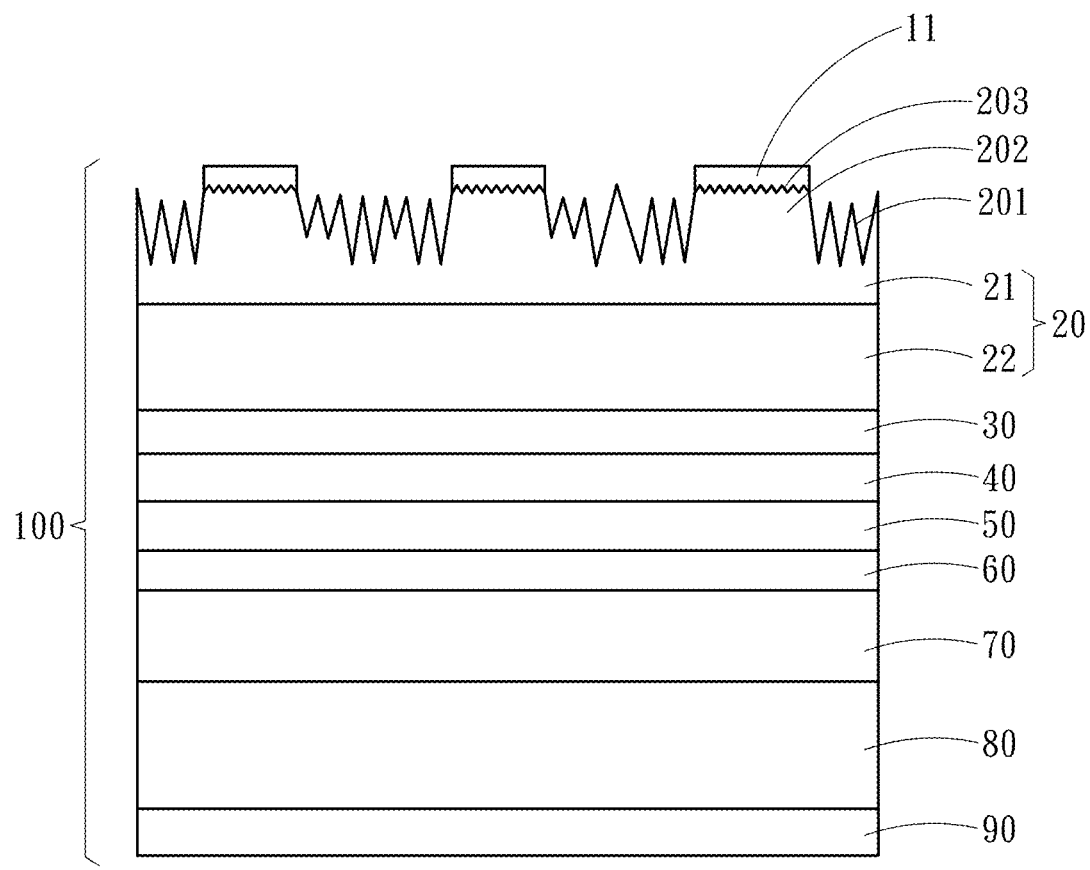

Referring to FIG. 3D, by a roughening process, on the adhesion surface 203 of the N-type semiconductor layer 20 (i.e., the first N-type semiconductor layer 21) without the etch protection layers 11, an irregular surface 201 is formed. Further, through shielding provided by the etch protection layers 11, the plurality of contact platforms 202 are formed on the N-type semiconductor layer 20 (i.e., the first N-type semiconductor layer 21), thereby completing the structure of the present invention. Similarly, the irregular surface 201 may be formed by a physical approach such as plasma impact.

Figure 3E:
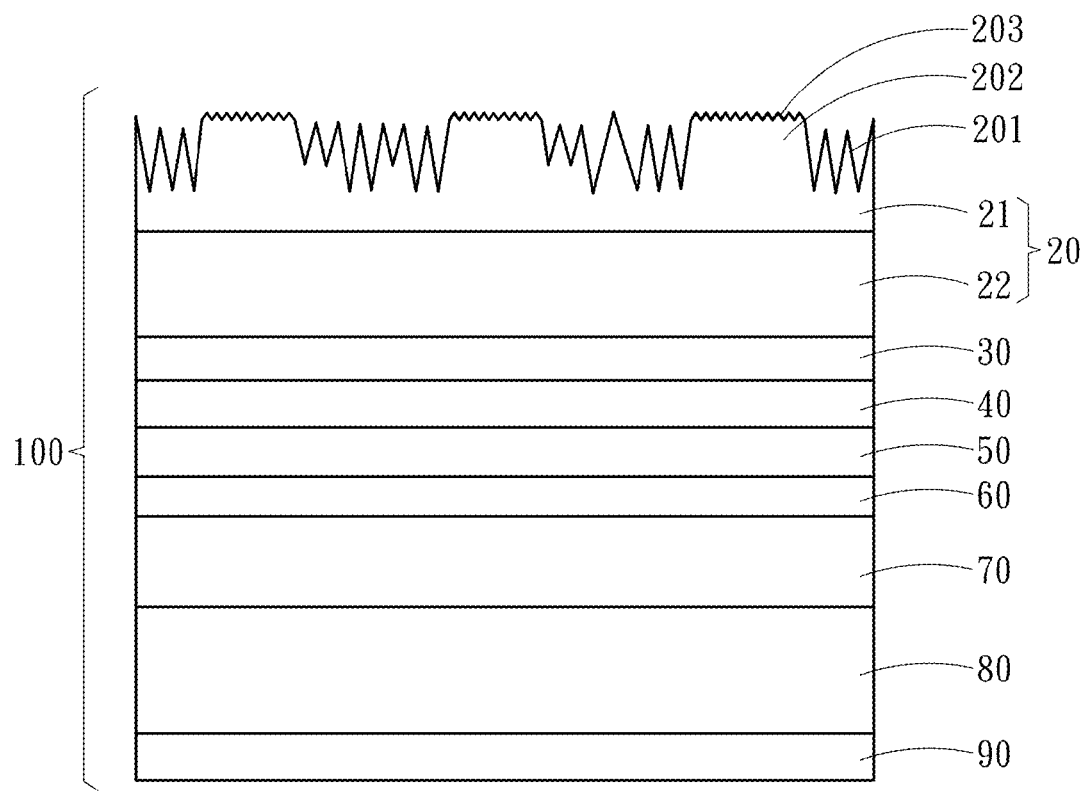

Referring to FIG. 3E, by an etching process or a lift-off process, the etch protection layers 11 are removed to reveal the contact platforms 202 having roughness between 0.01 μm and 0.1 μm.

Figure 3F:
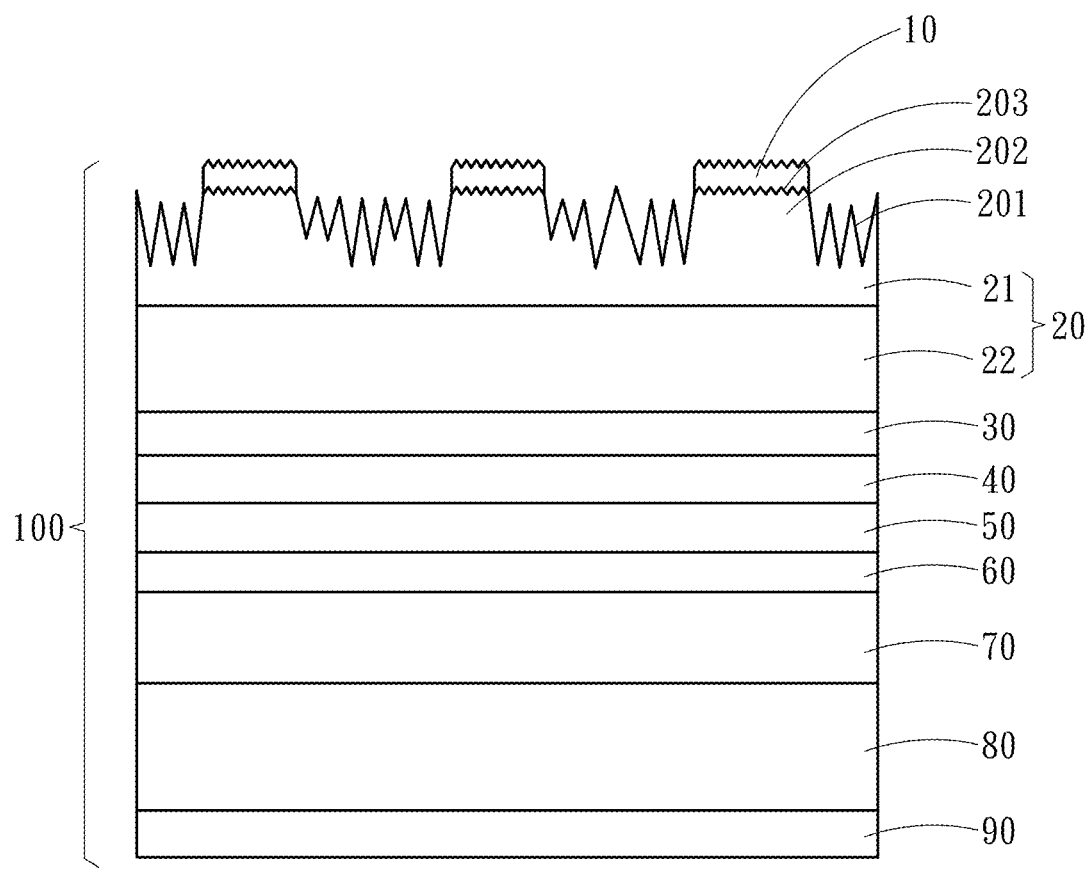

Referring to FIG. 3F, by a thin-film process such as evaporation, the N-type electrodes 10 corresponding to patterned arrangement of the contact platforms 202 are formed on the contact platforms 202. Since the contact platforms 202 have roughness between 0.01 μm and 0.1 μm, the surfaces of the N-type electrodes 10 are also formed with the appropriate roughness between 0.01 μm and 0.1 μm, thus completing the structure of the present invention.

Figure 4:
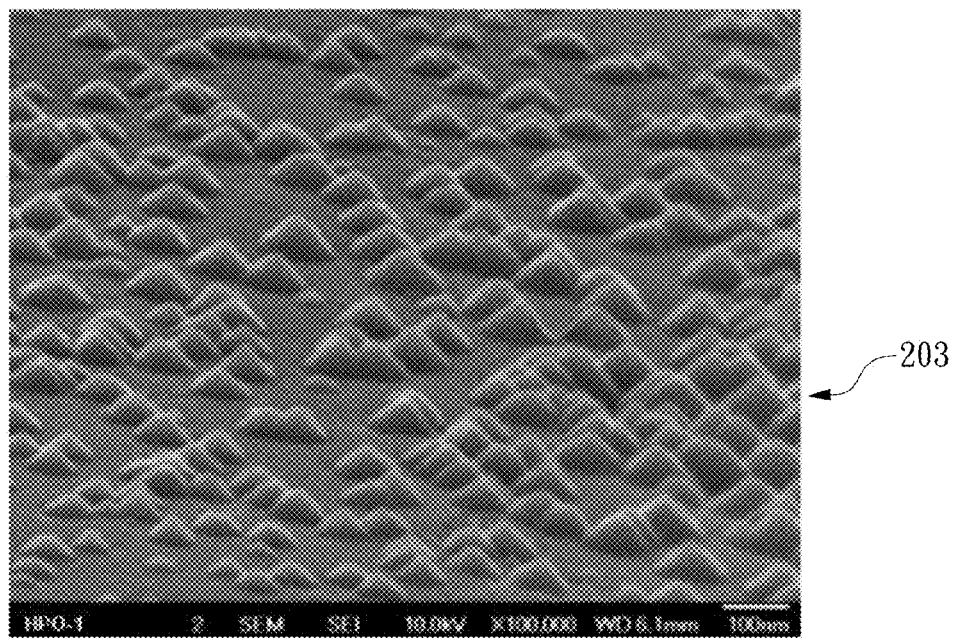
FIG. 4 is an electron microscope diagram of a contact platform surface according to one embodiment of the present invention.
Figure 5:
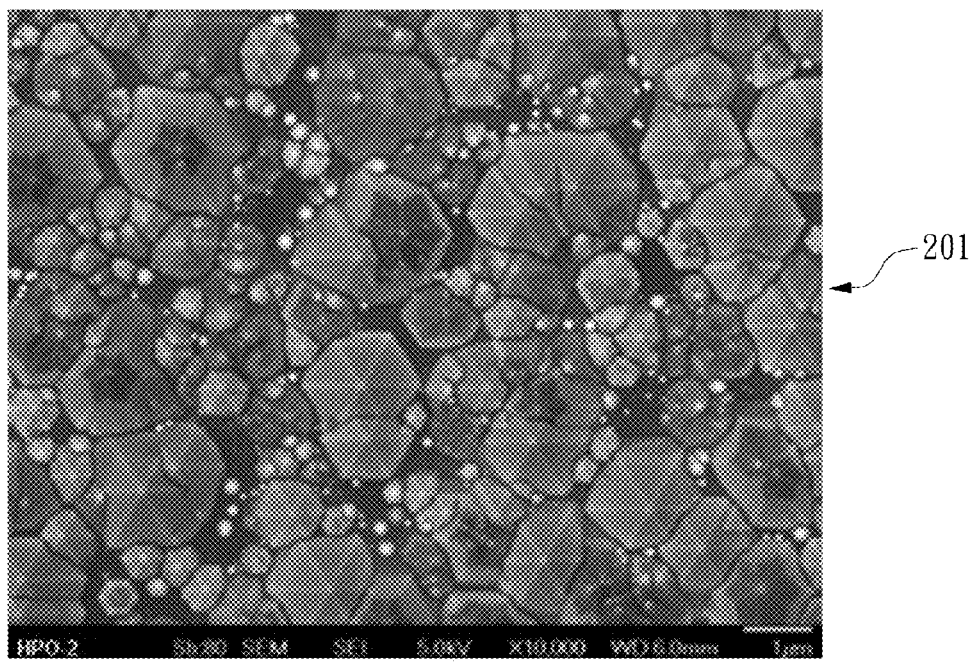
FIG. 5 is an electron microscope diagram of an irregular surface according to one embodiment of the present invention.

FIGS. 4 and 5 are electron microscope diagrams according to an embodiment of the present invention. FIG. 4 shows an electron microscope diagram of surfaces of contact platforms 202 (i.e., the adhesion surfaces 203), which have roughness of approximately 0.1 μm. Voids are not generated and good adhesion is provided at the N-type electrodes 10 formed by evaporation. FIG. 5 shows an electron microscope diagram of the irregular surface 201, which has roughness of approximately 1 μm, such that is capable of providing remarkable light scattering effect.

With the above description, it is demonstrated that the N-type electrodes 10 are respectively formed on the contact platforms 202 to be in contact with the N-type semiconductor layer 20. Interface having appropriate roughness is provided by the contact platforms 202 having roughness between 0.01 μm and 0.1 μm. As such, when the N-type electrodes 10 are formed by the thin-film process, not only voids are not generated but also good adhesion is provided to at the same time prevent issues of carrier confinement and disengagement caused by generation of dangling bonds of molecules in the fabrication of the irregular surface. Therefore, the structure of the present invention ensures satisfactory electrical contact between the N-type electrodes 10 and the contact platforms 202 to thereby increase the light emitting efficiency.

What is claimed is:

1. A light-emitting diode (LED) electrode contact structure for an LED, the LED comprising a plurality of N-type electrodes, an N-type semiconductor layer, a light-emitting layer, a P-type semiconductor layer, a mirror layer, a buffer layer, a binding layer, a permanent substrate and a P-type electrode that are stacked in sequence, the N-type semiconductor layer including an irregular surface; the LED electrode contact structure being characterized in that:

the N-type semiconductor layer includes a plurality of contact platforms which are formed and distributed thereon in a patterned arrangement, the irregular surface is formed at areas on the N-type semiconductor layer without the plurality of contact platforms, the plurality of contact platforms have roughness between 0.01 μm and 0.1 μm, and surfaces of the N-type electrodes are formed with roughness between 0.01 μm and 0.1 μm corresponding to surfaces of the plurality of contact platforms.

2. The LED electrode contact structure of claim 1, wherein the irregular surface has roughness between 0.5 μm and 1 μm.

3. The LED electrode contact structure of claim 1, wherein the N-type semiconductor layer comprises a first N-type semiconductor layer and a second N-type semiconductor layer, and the plurality of contact platforms are formed on the first N-type semiconductor layer.

4. The LED electrode contact structure of claim 1, wherein the buffer layer is made of a material selected from the group consisting of titanium, tungsten, platinum, nickel, aluminum and chromium.

5. The LED electrode contact structure of claim 1, wherein the binding layer is made of a material selected from the group consisting of a gold tin alloy, a gold indium alloy and a gold lead alloy.

6. The LED electrode contact structure of claim 1, wherein the permanent substrate is selected from the group consisting of a silicon substrate, a copper substrate, a copper tungsten substrate, an aluminum nitride substrate and a titanium nitride substrate.

7. The LED electrode contact structure of claim 1, wherein the mirror layer is made of a material selected from the group consisting of aluminum, nickel, silver and titanium.

* * * * *